United States Patent
Olmsted et al.

(10) Patent No.: US 11,410,508 B2
(45) Date of Patent: Aug. 9, 2022

(54) BEACON SYSTEM

(71) Applicant: LMD Applied Science, LLC, Rochester, NY (US)

(72) Inventors: Brian L. Olmsted, Spencerport, NY (US); Jeffrey W. Mock, Rochester, NY (US); John A. Kowalczyk, Jr., Fairport, NY (US)

(73) Assignee: LMD Applied Science, LLC, Rochester, NY (US)

( * ) Notice: Subject to any disclaimer, the term of this patent is extended or adjusted under 35 U.S.C. 154(b) by 413 days.

(21) Appl. No.: 15/832,037

(22) Filed: Dec. 5, 2017

(65) Prior Publication Data

US 2018/0218574 A1    Aug. 2, 2018

Related U.S. Application Data

(60) Provisional application No. 62/430,681, filed on Dec. 6, 2016.

(51) Int. Cl.
| | |
|---|---|
| G02B 27/30 | (2006.01) |
| G02B 5/136 | (2006.01) |
| G02B 5/08 | (2006.01) |
| F21V 1/00 | (2006.01) |
| F21V 7/00 | (2006.01) |
| G08B 5/36 | (2006.01) |
| H01S 5/00 | (2006.01) |
| H01S 5/042 | (2006.01) |
| H01S 5/34 | (2006.01) |
| G08B 5/00 | (2006.01) |
| H01S 5/02255 | (2021.01) |
| H01S 5/0222 | (2021.01) |

(52) U.S. Cl.
CPC ............... *G08B 5/36* (2013.01); *G08B 5/002* (2013.01); *H01S 5/0071* (2013.01); *H01S 5/02255* (2021.01); *H01S 5/0428* (2013.01); *H01S 5/3402* (2013.01); *H01S 5/0222* (2013.01)

(58) Field of Classification Search
CPC .. G02B 27/30; G02B 5/12; G02B 5/10; B60R 1/12; B60R 1/082; F21Y 2101/02; F21V 7/22; F21V 17/00; F21V 7/04
USPC ....... 359/641, 868, 869, 838, 850, 515, 546; 315/86, 297, 360, 294; 362/235, 341, 362/241, 245, 247, 296.05, 310, 348
See application file for complete search history.

(56) References Cited

U.S. PATENT DOCUMENTS

| | | | | |
|---|---|---|---|---|
| 4,111,564 A | * | 9/1978 | Trice, Jr. .............. | G01C 15/004 356/153 |
| 5,548,610 A | * | 8/1996 | Bouadma ................ | H01L 27/15 257/E27.12 |
| 6,543,911 B1 | * | 4/2003 | Rizkin .................... | F21V 5/046 362/240 |
| 10,361,348 B2 | * | 7/2019 | Yoshizawa ................ | F21V 7/06 |
| 2002/0136027 A1 | * | 9/2002 | Hansler ................. | F21V 7/0008 362/559 |
| 2004/0056779 A1 | * | 3/2004 | Rast ........................ | B63B 22/16 340/985 |
| 2006/0291209 A1 | * | 12/2006 | Booth .................... | F21V 7/0008 362/247 |

* cited by examiner

*Primary Examiner* — Dawayne Pinkney
(74) *Attorney, Agent, or Firm* — Lee & Hayes, P.C.

(57) ABSTRACT

An example beacon system includes a housing, a laser module at least partly retained within the housing, and a controller operable to control the laser module.

18 Claims, 15 Drawing Sheets

BEACON SYSTEM

CROSS-REFERENCE TO RELATED APPLICATIONS

This nonprovisional patent application claims the benefit of U.S. Provisional Application No. 62/430,681, filed Dec. 6, 2016, the entire disclosure of which is incorporated herein by reference.

FIELD OF THE INVENTION

The present invention relates to beacon systems, and more particularly to beacon systems usable to create wide area emissions such as may be suitable for a laser beacon system.

DESCRIPTION OF RELATED ART

Rescue and identification beacons that do not emit radio frequency signals are of particular interest in applications where radio frequency communications may be difficult to establish and maintain, where electronic interference or absorption prevents reliable communication, or where detection and interception of such signals may be problematic.

One way to meet these requirements is to use portions of the electromagnetic spectrum that include infrared light. However, there are a number of challenges associated with providing beacons of this type. Meeting size and weight constraints is critical to the success of such beacon systems as these constraints impact the extent to which such devices are practically portable or hand-held. Additionally, such systems must be survivable in portable applications and must be capable of extended operation. Such requirements can significantly be perceived as having contradictory implications, with a desire for small size and light weight operation being contrary to the requirement of ruggedness which requires extras weight and size and the requirement of extended operation requiring significant power supplies which can add weight and volume again increasing challenges associated with providing for the desired ruggedness.

Further, systems that are highly complex or that require precise placement of and alignment of optical and electronic components tend to be more vulnerable to damage through incidental contact, thermal extremes, or other damage that may occur during operation. This again raises the requirements for the ruggedness of the system.

Additionally, systems are desired that enable detection of signals from the beacon across a wide range of positions relative to the beacon and that do not require moving parts to accomplish this result.

What is needed therefore is a small, portable, light weight, beacon system that can generate appropriate signals without requiring precise placement of optical components.

Further, such a beacon system should be designed to avoid unnecessary emission of non-radio frequencies in ways that might allow detection or interception of the emissions while allowing movement of the person.

Finally, the beacon system must be easily used with any interactions with the system designed to enable, rapid confident use by field operatives who may be distracted, injured, under fire and who may be wearing gloves or other protective equipment.

DETAILED DESCRIPTION OF THE DRAWINGS

Figure 1:
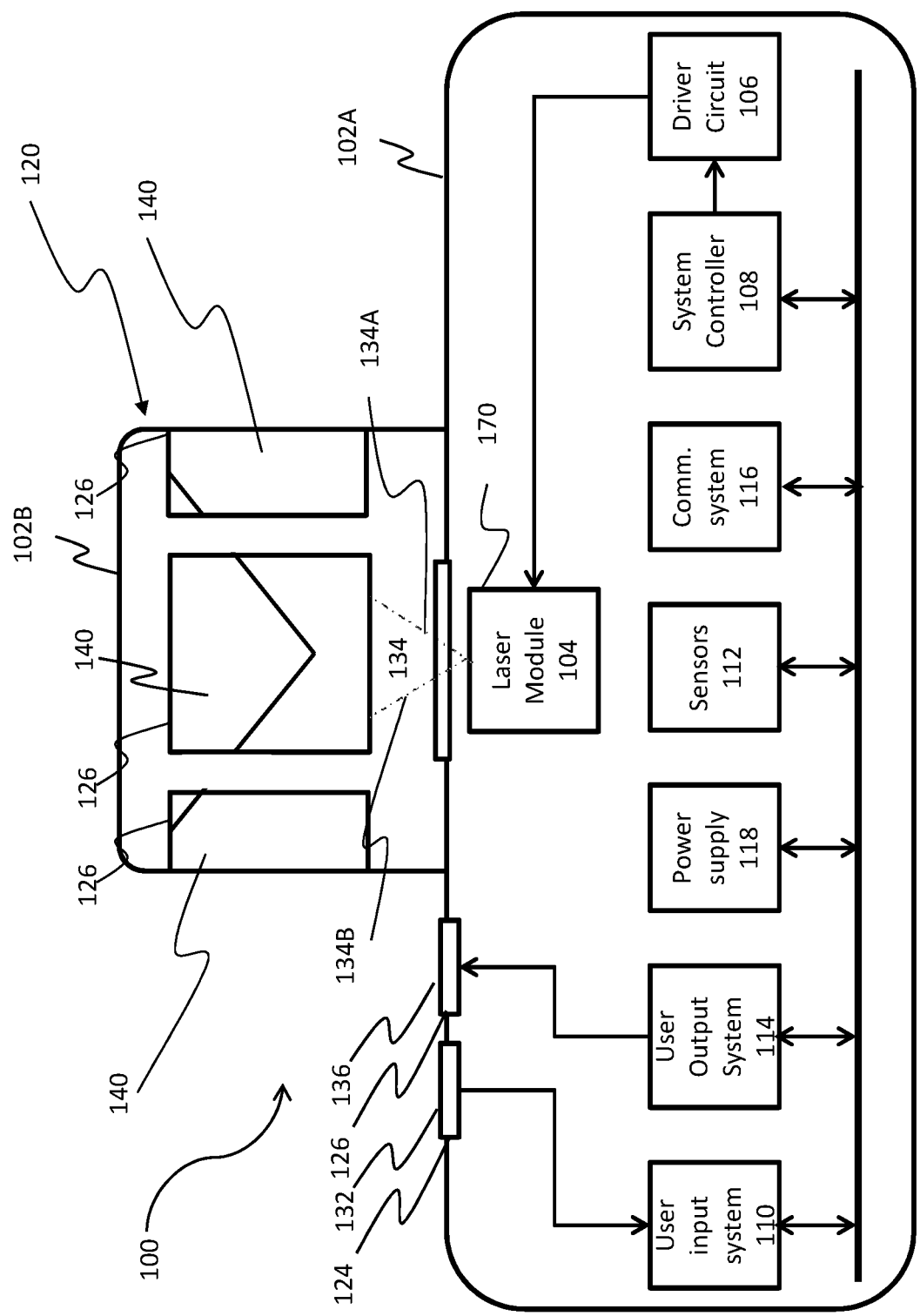
FIG. 1 is a schematic view of first embodiment of a beacon system.
Figure 2:
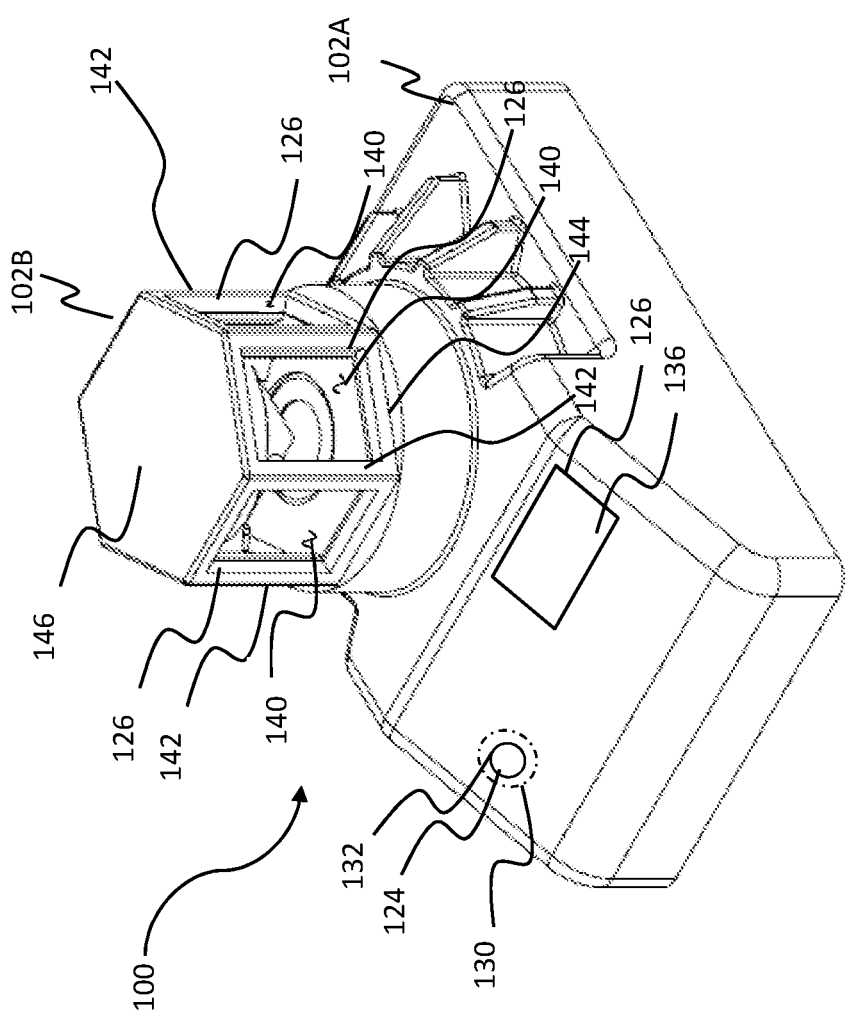
FIG. 2 is a top, front, left side, isometric view of the embodiment of FIG. 1.
Figure 3:
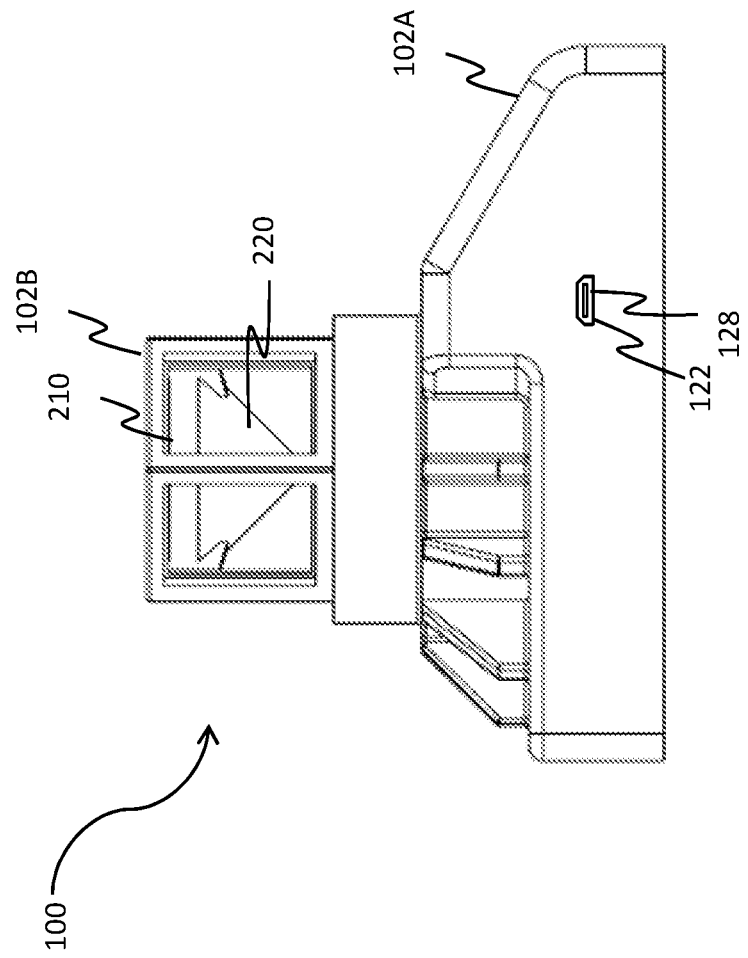
FIG. 3 is a left side elevation view of the embodiment of FIG. 1.
Figure 4:
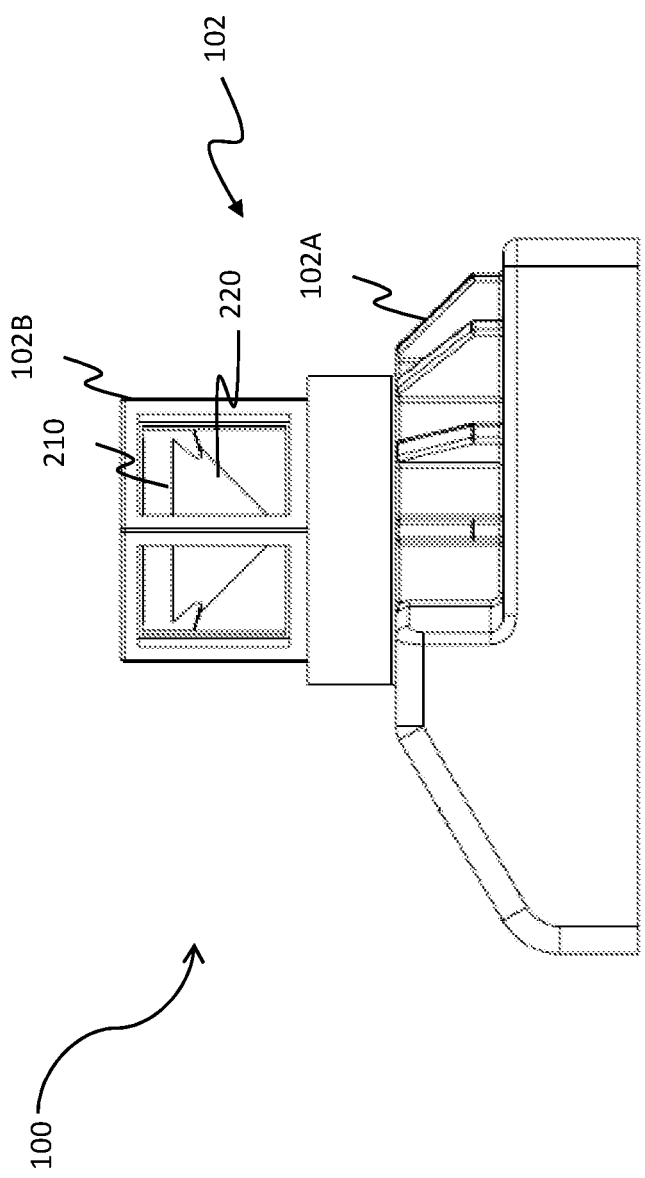
FIG. 4 is a right side elevation view of the embodiment of FIG. 1.
Figure 5:
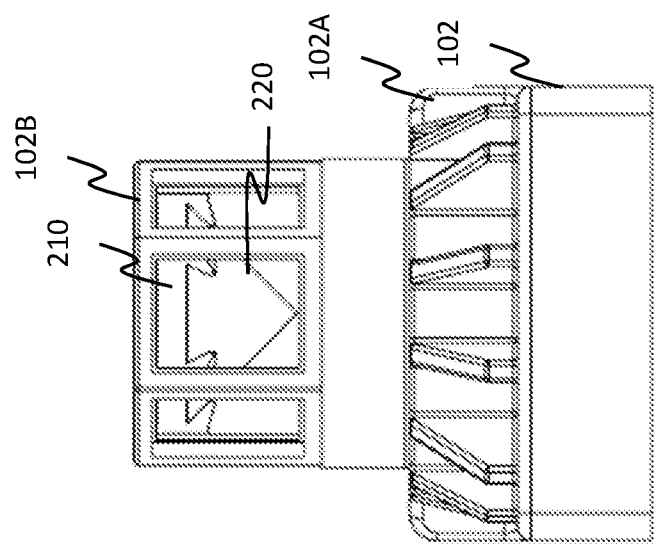
FIG. 5 is a rear elevation view of the embodiment of FIG. 1.
Figure 6:
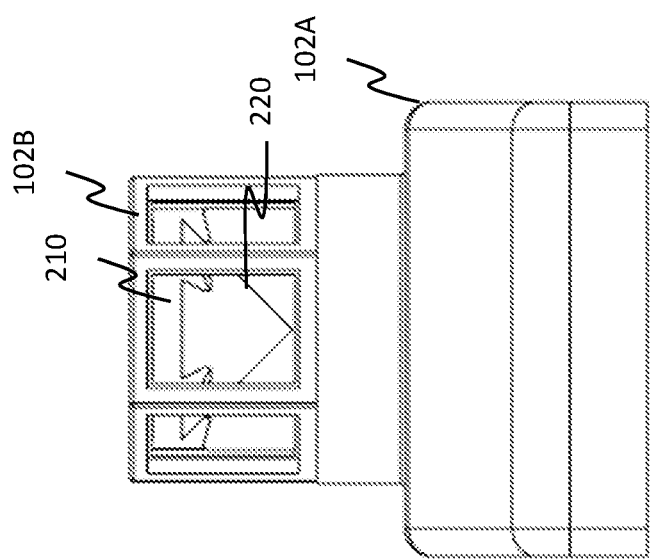
FIG. 6 is a front elevation view of the embodiment of FIG. 1.

Unless stated otherwise herein, the drawings are not necessarily to scale. FIG. 1 is a schematic view of an embodiment of a beacon system 100. FIG. 2 is a top, front, left side, isometric view of the embodiment of FIG. 1 while FIGS. 3, 4, 5, 6 and 7 illustrate respectively right, left, rear front and top views of the embodiment of FIG. 1. In the embodiment illustrated in FIGS. 1-7 beacon system 100 has a system housing 102 that encompasses, substantially encloses, or otherwise retains, a laser module 104, a drive circuit 106, a system controller 108, a user input system 110, sensors 112, a user output system 114, a communication system 116, and a power supply 118.

In this embodiment, system controller 108 receives signals from user input system 110, sensors 112, and communication system 116 and determines whether a response to such signals is required. When system controller 108 determines to respond to received signals by causing a laser emission, system controller 108 sends signals to drive circuit 106 causing drive circuit 106 to supply electrical energy from power supply 118 to laser module 104 in a manner that causes laser module 104 to emit laser emissions 134. System controller 108 can also generate signals that cause user output system 114 to generate a human perceptible output. Additionally, system controller 108 can send signals to communication system 116 causing communication system 116 to send signals to other devices, to cause communication system 116 to receive signals from other devices or both. Power supply 118 provides electrical energy to drive circuit 106, system controller 108, user input system 110, sensors 112, user output system 114, and communication system 116. As is shown in FIGS. 1-7, in this embodiment system housing 102 provides an enclosure for each of the components of beacon system 100 to provide an enclosed a stand-alone beacon device. However, in embodiments, components such as laser module 104, drive circuit 106, system controller 108, user input system 110, sensors 112, user output system 114 and communication system 116 and power supply 118 may be external to system housing 102 in whole or in part.

System housing 102 can be formed of any of a variety of rigid materials such as composites, laminates, plastics or metals. In one configuration, system housing 102 can be formed of an extruded aluminum, thereby providing sufficient strength without requiring significant weight while also providing good thermal transfer properties. System housing 102 can be fabricated or assembled in any of a variety of ways. In one embodiment, system housing 102 is machined such as by EDM (electrical discharge machining), assembled, or molded if composites, laminates, plastics or metals are employed for system housing 102. System housing 102 also can be fabricated using other conventional techniques including but not limited to additive assembly techniques.

In the embodiment illustrated in FIGS. 1-7 system housing 102 has a base module 102A and a distribution module 102B. Base module 102A may be joined to distribution module 102B in a manner that is intended to be a generally permanent combination of the type for example that is disassembled only during repair or heavy maintenance operations. Alternatively, base module 102A to be joined, mounted, fixed, or otherwise mechanically linked to distribution module 102B in a fashion that allows separation of base module 102A from distribution module 102B such that base module 102A can be used without distribution module 102B or so that more than one type of distribution module 102B can be used with base module 102A.

In FIGS. 1-7 base module 102A is illustrated as being generally rectangular in top down profile with a generally flat bottom surface. However, in other exemplary embodiments, base module 102A or other components of system housing 102 may be configured to provide surfaces that enable system housing 102 to be joined, fixed, held, mounted or otherwise positioned for movement by personnel, such as being carried manually or in holsters, helmets, or other bodily worn equipment. System housing 102 can also be joined to weapon systems such as a hand-held weapon system or to any of a variety of direct fire weapons such as handheld, side, and small firearms. Such firearms include, but are not limited to, pistols, rifles, shotguns, automatic arms, semi-automatic arms, rocket launchers and select grenade launchers bows.

In other embodiments, system housing 102 can be configured to mount any known dismounted or dismounted crew-served weapon, including but not limited to machine guns, artillery, recoilless rifles and other types of crew served weapons. In still other embodiments, system housing 102 can be shaped, sized or otherwise provided in forms that more readily interface with any of a variety of clamping or mounting mechanisms including but not limited to a Weaver-style Picatinny rail or dove tail engagement for mounting to these firearms. In further exemplary embodiments, system housing 102 can be configured as a component part of a hand-held weapon system 12 or other direct fire weapon, such as a foregrip, sight or stock.

System housing 102 may be joined to medical equipment or any other stationary or movable equipment. Additionally, system housing 102 may be connected to or integrated into moving or movable vehicles such as ground, air, sea or other movable objects.

In the embodiment of FIGS. 1-7, distribution module 102B is illustrated as being generally hexagonal in top down profile and as providing a plurality of distribution module windows 140 arranged, in this embodiment, in individual ones of openings 126 that are provided between supports 142 that extend from a base plane 144 to a roof 146. In this embodiment distribution module 102B may be joined to base module 102A such as by being welded, fastened or otherwise mounted thereto.

Drive circuit 106 receives power from power supply 118 and control inputs from system controller 108. In response to the control inputs received from system controller 108, drive circuit 106 generates signals that cause laser module 104 to emit laser light. In the embodiment that is illustrated in FIGS. 1-7 laser module 104 is not directly connected to power supply 118 but rather receives power by way of drive circuit 106 such that drive circuit 106 can control the time, duration, and intensity of electrical energy supplied to laser module 104. Drive circuit 106 may be configured to assist in tuning and/or otherwise controlling the output of laser module 104. Drive circuit 106 can be constructed to provide either pulsed or continuous operation of laser module 104. The rise/fall time of the pulse, compliance voltage and current generated by drive circuit 106 for the laser module 104 are selected based at least in part upon power consumption, heat generation and desired beam intensity considerations. These parameters may also be selected to cause laser module 104 to produce a beam having a desirable wavelength, frequency, transverse mode number and/or other quantifiable characteristics.

Depending on the desired output, drive circuit 106 can enable operation of the laser module 104 as a continuous or pulsed laser, such as by passive, active, or controlled switching. Although specific values depend upon the particular laser module 104 and intended operating parameters, it is contemplated the peak power draw of drive circuit 106 may be between approximately 1 amp and approximately 10 amps, with an average current draw between approximately 0.1 amps and approximately 1.0 amps. As the required voltage may be between on average approximately 9 volts and approximately 12 volts, approximately 0.9 W to approximately 12 W may be consumed. This may represent a substantial power consumption as well as heat generation. It will be appreciated that these power levels, current levels and voltage levels are exemplary only and are not limiting.

In an exemplary embodiment, drive circuit 106 may assist in controlling and/or modifying the power level of laser module 104 to aid in penetrating components or conditions of the atmosphere through which beacon system 100 will direct laser emissions 134. Such components or conditions may include, for example, snow, rain, fog, smoke, mist, clouds, wind, dust, gas, sand, and/or other known atmospheric or airborne components. For example, drive circuit 106 can be configured to controllably, manually, and/or automatically increase the current and/or voltage directed to strengthen and/or intensify laser emissions 134 emitted by laser module 104 in such conditions.

It is also understood that laser module 104 can have one or more than one laser and where there is more than one laser, the laser s may be of the same or of a different type and may be of a same type but emitting at different wavelengths. In one exemplary embodiment of this type, a laser module 104 can have a semiconductor laser in the form of a mid-range adapted infrared quantum cascade laser and another semiconductor laser in the form of a long-wave adapted infrared quantum cascade laser. Other combinations of semiconductor lasers 180 are possible including but not limited to inter-band quantum cascade lasers, VCSELs or grating surface-emitting lasers. Such lasers can emit light for example and without limitation in visible, infrared including near infrared, mid-wave infrared and long-wave infrared, and ultraviolet wavelengths.

Alternatively, in other embodiments, laser module 104 can include components that can receive signals from drive circuit 106 and that can adjust power supplied to semiconductor laser 180 in response to such signals. In such an alternative embodiment, laser module 104 may receive electrical energy directly from power supply 118.

In the embodiment illustrated in FIGS. 1-7 system housing 102 has plurality of openings shown as openings 120, 122, 124 and 126. As will be discussed in greater detail below, openings 120 are occupied by an distribution module windows 140, while opening 124 is occupied by a user input sensor 132 and opening 126 is shown as being occupied by a user output video display 136. In certain embodiments, seals (not shown) can be supplied at openings 120, 122, 124 and 126 to provide a barrier to resist entry of contaminants so as to protect the components disposed within system housing 102 from water, dust, vapors, or other harmful contaminants commonly experienced in non-controlled environment use. Optionally, system housing 102 can be hermetically sealed, at least in part around laser module 104.

User input system 110 includes human operable sensors such as switches, touch pads, joysticks, audio, video, keypads, key locks, proximity sensors or any other known types of sensors that can detect a user input action and that can provide signals to system controller 108 indicative of the user input action. In the embodiment of FIGS. 1-7, user input system 110 can use user input sensor 132 to enable manual selection of three different operating mode selections and an off selection. In embodiments, user input system 110 and system controller 108 may use signals from sensors 112 to detect user input actions.

Sensors 112 can include any form of device that can be used to detect or otherwise sense conditions inside or outside of system housing 102 that may be useful to system controller 108 in determining actions to be taken in operating beacon system 100. Sensors 112 can include without limitation, light sensors such as photovoltaic cells, contact switches, opto-electronic sensors such as light beam emitter and sensor pairs, electro-mechanical sensors such as limit switches, strain sensors, and proximity sensors such as Hall-effect sensors, thermal sensors, meteorological sensors, such as humidity sensors, accelerometers, orientation sensors and other known sensors and transducers.

User output system 114 can include, any type of device that can generate a human perceptible signal including without limitation equipment that can generate a visually detectable signal such as video display 134 or other forms of light emitters are modulators or other sources of human perceptible visual signals as well any form of device that can generate audio signals or tactile signals from which a user can determine for example, and without limitation, a status of beacon system 100, an operating mode of beacon system 100, that beacon system 100 is emitting a laser emissions 134 and a characteristics of the laser emissions 134 that beacon system 100 is emitting or will emit when instructed to do so. In this regard, user output system 114 can include circuits with transducers that can convert energy supplied by power supply 118 into such visual, audio or tactile signals along one or more driving circuits to cause such transducers to generate the visual, audio or tactile signals.

Communication system 116 can include any combination of known communication circuits including wired or wireless transponders, transceivers, transmitters, receivers, antennas, modulators, de-modulators, encryption and de-encryption circuits or software and can provide other known components to facilitate data communication, the exchange of control signals or power exchanges in wired or wireless form.

Depending upon the anticipated power requirements, available space, and weight restrictions, the batteries can be N-type batteries or AA or AAA batteries. Additionally, a lithium/manganese dioxide battery such as military battery BA-5390/U, manufactured by Ultralife Batteries Inc. of Newark, N.Y. can be used with beacon system 100. A battery used in a battery-type power supply 118 can be recyclable, disposable or rechargeable. Battery compartment can be formed of a weather resistant, resilient material such as plastic, and shaped to include receptacles for receiving one or more batteries or other power storage devices. Further, the battery compartment may be selectively closeable or sealable to prevent environmental migration into the compartment or to create a hermetically sealed environment therein.

In other exemplary embodiments, power supply 118 can take the form of a fuel cell, capacitive system or other portable electrical energy storage or generation system. It is understood that any type of power supply 118, preferably portable and sufficiently small in size can be utilized.

It will also be appreciated that, in embodiments, power supply 118 can be supplied by way of external sources through for example, port 128 or through noncontact charging technologies such as inductive charging. Power received through power supply 118 or through such other sources can be used to directly operate beacon system 100 or to supply power that may supplement power created by batteries or other power sources positioned within system housing 102 or to recharge such batteries or other power sources.

As is noted above, system controller 108 drives operation of beacon system 100 and receives signals from user input system 110, sensors 112 and communication system 116 that system controller 108 can use to control operation of beacon system 100. System controller 108 comprise for example a computer, a microprocessor, micro-controller, programmable analog logic device or a combination of programmable or hardwired electronic devices capable of performing the functions and actions described or claimed herein.

In the embodiment of FIGS. 1-8 system controller 108 optionally determines a mode of operation of beacon system 100 in response to a signal from any of user input system 110, sensors 112 or communication system 116.

In one non-limiting example, an activation area 130 may be defined in which a user can make a user input action that can be sensed to determine whether to activate or deactivate beacon system 100. For example a user input sensor 132 may be positioned on base module 102A to detect the user input action within activation area 130. In one example sensor 132 may take the form of a mechanical, electromechanical, optical, electro-optical, magnetic or Hall-effect or any other type of switch capable of detecting when a finger is pressed against the switch. In other embodiments, sensor 132 may not require contact. For example and without limitation sensor 132 may be of a type that senses proximity or touch through capacitive sensing circuits, ultrasonic sensing circuits, thermal sensing circuits or an optical sensor.

When system controller 108 receives signals from user input system 110 indicating that a user input action has been made, such as by putting a finger against or proximate to activation area 130, system controller 108 can determine an appropriate response, such as sending a signal to system controller 108.

Other modes of operation are possible and any or all of user input system 110, sensors 112 and communication system 116 can be used to receive or sense user input actions, conditions or signals that may be provided to system controller 108 and that system controller 108 may use to determine that a particular additional mode of operation is appropriate.

For example a "Stand By" mode of operation can be provided to conserve stored energy of from power supply 118 while maintaining the beacon system 100 in an advanced state of readiness for use. For example, communication system 116 may receive signals indicating that beacon system 100 is to enter the "Stand By" mode can send signals to system controller 108 from which system controller 108 can determine for example that this "Stand by" mode of operation has been selected remotely or that this standby mode should be selected based upon signals received.

In one example of this type of situation, system controller 108 can determine that a "Stand by" mode has been selected and can respond to this by sending signals to drive circuit 106 causing drive circuit 106 to begin supplying power circuits or subsystems, if any, that require some time to reach a state where they are ready for immediate activation. Not all circuits or subsystems will need to be activated at such times and a "Stand By" option relieves the operator from being confronted with the choice of operating the beacon system 100 in a high power consumption "On" mode prior to the need to do so and the choice of holding the device in the "Off" state to conserve power with the understanding that there will be a lag time before activation.

In another example of such a mode, user input sensor 132 may be operable to receive a user input action from which system controller 108 can determine that a "test" mode is to be used. Such a "test" mode may be provided wherein for example, system controller 108 can cause laser module 104 to emit a laser emissions 134 at a lower power than used for other purposes. This lower powered laser emissions 134 can be used to allow verification of the operational status of beacon system 100 such as by emitting a lower powered laser test beam that can be directed at, for example, nearby targets for training purposes or at target strips or pages that change in appearance when illuminated by the laser in the test mode.

Figure 7:
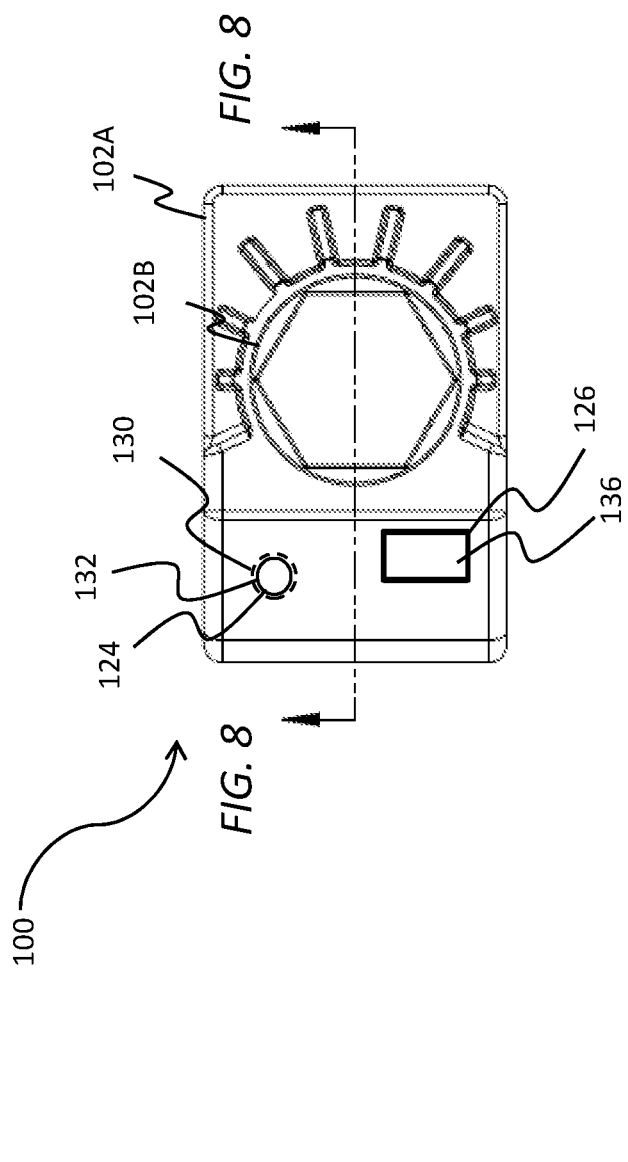
FIG. 7 is a top view of the embodiment of FIG. 1.
Figure 8:
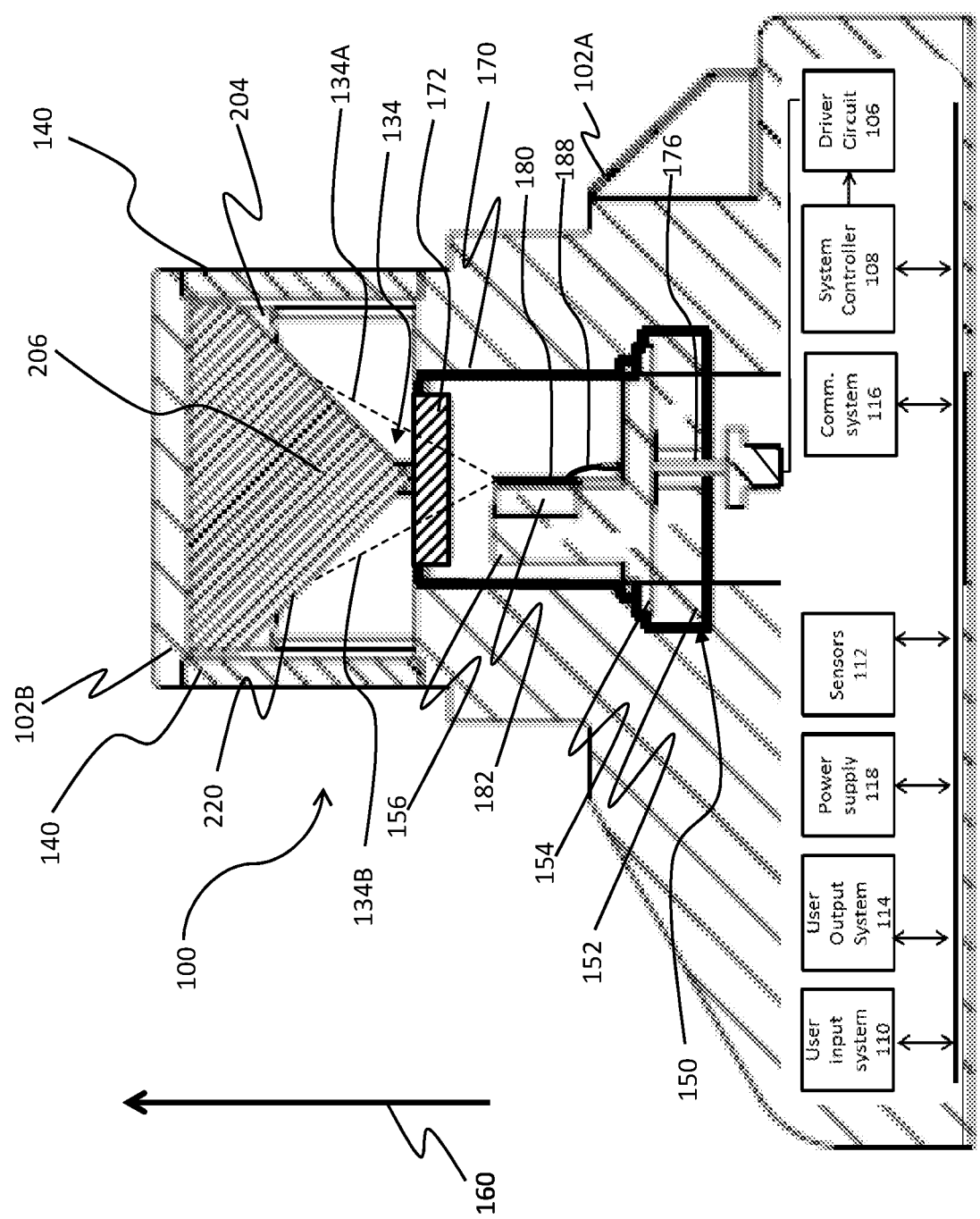
FIG. 8 is a cross-section view of the embodiment of FIG. 1.

Turning now to FIG. 8 what is shown is a cross-section view of one example embodiment of beacon system 100 of FIGS. 1-7 taken as shown in FIG. 7. As is shown in FIG. 8, laser module 104 has a laser can 150 with a base 152 having a front side 154 from which a header 156 extends in a first direction 160 and an optional housing 170 shaped to combine with front side 154 to form a sealed environment about header 156. In embodiments, housing 170 can be omitted with base module 102A used to provide protection for semiconductor laser 180.

A semiconductor laser 180 is mounted to header 156. In this embodiment, semiconductor laser 180 is mounted to header 156 by way of a submount 182. Semiconductor laser 180 is also joined to at least one electrical conductor 186 by way of a wirebond 188 or other electrical connections so that electrical energy can be supplied to semiconductor laser 180 from insulated terminals 178 causing semiconductor laser 180 to have laser emissions 134 that are generally conical.

Semiconductor laser 180 is positioned on submount 182 to direct laser emissions 134 from an emission face 184 in first direction 160 through a core window 172 on a front portion 174 of housing 170. Semiconductor laser 180 or submount 182 can be joined to header 156 in any of a variety of ways including conventional fasteners, solders, conductive adhesives and the like. Semiconductor laser 180 in turn is typically bound to submount 182 using soldering techniques, although other techniques are also known.

Semiconductor laser 180 can comprise for example, any semiconductor device that can emit a laser output. Examples of semiconductor laser 180 include but are not limited to a diode laser, quantum cascade lasers, inter-band cascade lasers. These types of semiconductor lasers 180 share generally the characteristics of being made from a semiconductor material and having a emitting a divergent laser light beam while also generating a meaningful amount of heat that must be dissipated to protect semiconductor laser 180.

In the embodiment illustrated in FIGS. 1-8, semiconductor laser 180 emits divergent laser emissions 134 having a wavelength in the infrared region such as between 2μ and 30μ wavelength. However, in other embodiments, semiconductor laser 180 can emit laser emissions 134 having any of a wide range of wavelengths including but not limited to ultraviolet wavelengths, visible wavelengths, and near infrared wavelengths. For the purposes of the following discussion, it will be assumed that in the embodiment of FIGS. 1-8, semiconductor laser 180 is a quantum cascade type laser.

Laser emissions 134 from beacon system 100 may be highly divergent and spread over a wide range of angles to assume for example and without limitation a cone shape. However, the intensity of the laser emissions 134 may vary across a cross sectional area of the of the cone. When operated to emit a single mode of laser emissions, laser emissions from semiconductor laser 180 may take on a Gaussian intensity distribution.

Figure 9:
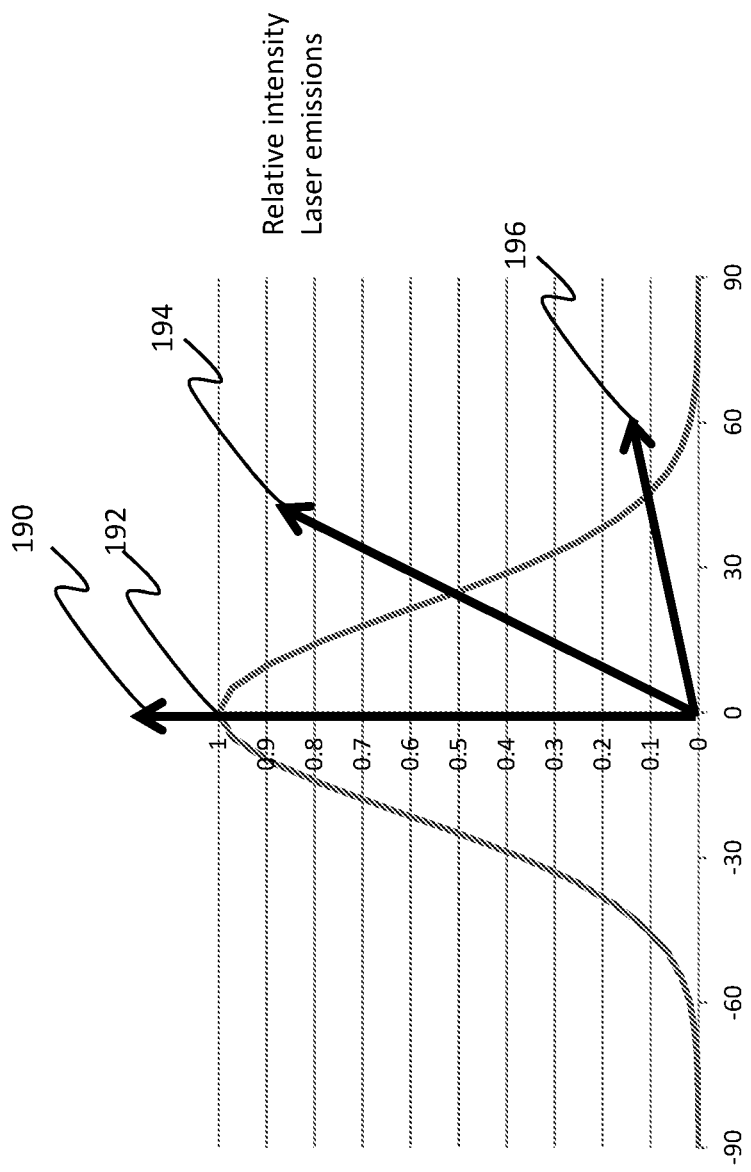
FIG. 9 is a chart that illustrates the relative intensities of laser emissions hypothetically observable from a semiconductor laser.

FIG. 9 is a chart that illustrates the relative intensities of laser emissions 134 hypothetically observable from semiconductor laser 180. As is shown in FIG. 9, an appropriate sensor (not shown) located along a direction 190 that is normal to emission face 184 of semiconductor laser 180 will sense a highest relative intensity 192 of laser emissions. As is also shown in FIG. 9, a relative intensity of sensed laser emissions 134 decreases as such a sensor is used to observe emission face 184 from a direction that is greater or less than normal direction 190. In this example, the relative observable intensity drops to a level that is half of the highest intensity in a half intensity direction 192 that is, in this example, between 25 and 30 degrees 194 from the normal direction 190 and ten percent of the highest relative intensity 192 when the same sensor observes emission face 184 a ten percent direction 196 that is between 30 and 60 degrees away from normal. Other arrangements are possible.

It will be appreciated that it can be difficult for a sensor to discriminate between an infrared signal from a beacon system 100 and background noise when the signal is greatly attenuated such as when the signal is being viewed at an extreme angle relative to emission face 184.

Accordingly, in this embodiment semiconductor laser 180 can be said to have a patterned laser emission 134 with a generally conical shape and for the purpose of the illustration in FIGS. 1 and 8 is shown with sides 134A and 134B illustrated at an angle relative to emission face 184 at which the sensed intensity of a sensed laser emission 134 will be 50% of the perceived intensity of laser emissions 134 if sensed at a position that is normal to emission face 184 with all other sensing conditions being the same. A sensor within the cone defined by sides 134A and 134B will typically be capable of detecting laser emissions 134 more reliably against background noise and environmental conditions that can have the effect of attenuating or scattering laser emissions 134 than one that is outside of cone 134.

However, it may still be difficult to sense laser emission 134 at long distances. For example, in a search and rescue mission, it may be necessary to sense laser emission 134 from any of a wide range of viewing angles using a sensor system mounted to an aircraft flying at a significant altitude, at a high rate of speed and at a significant distance on the order of 1 to 30 km for example. Additionally atmospheric conditions such as dust, smoke, and water vapor and other conditions may attenuate laser emission 134.

One expedient to overcome such difficulties is to increase the power of supplied to semiconductor laser 180. However, in many forms of semiconductor lasers 180 there are practical limitations as to the amount of energy that can be passed through such semiconductor lasers, one limitation is the amount of power available as extended periods of operation require power supplies that can be both large and heavy. Additionally, semiconductor lasers 180 have finite efficiencies with a proportion of the energy supplied to such semiconductor lasers 180 being converted into heat. As the heat increases the temperature of semiconductor laser 180 increases and the efficiency of the semiconductor laser 180 decreases. Accordingly, the temperature of the semiconductor laser 180 must be therefore be maintained. Often this is done using active cooling components such as thermoelectric coolers that themselves require power to operation and therefore increase the burdens on power supply.

In operation drive circuit 106 may be adapted to modulate the super-pulse pattern to create a pattern of emissions over time. This pattern may contain data such as an identification of beacon system 100, the operator of beacon system 100 or other data that may be encoded in such a signal. Drive circuit 106 may also modulate the super-pulse pattern at frequencies between 2 and 10 Hz in order to make the appearance of the pattern more identifiable to human observers. Similarly, drive circuit 106 may also modulate the super-pulse pattern at other frequencies or patterns to make the pattern more identifiable to automatic equipment that may be used to locate either beacon system 100 or other objects or events that may be sensed using thermal or other types of sensing. Such modulation may be performed in a manner intended to prevent mis-identification of laser emissions 134 as other sources of detected light so as to prevent automatic activation of systems on search equipment such as imaging systems, imager protection systems and other systems that automatically act to protect search drones, aircraft or other systems monitoring the area. Further, such modulation may be user programmable either by way of user input system 110, port 125 or communication system 116.

Another expedient is to use additional optics to focus the energy emitted by semiconductor laser 180 to a narrow pathway. Conventionally, these divergent emissions are then shaped to conform to desired emission patterns, often collimated or partially collimated using optics that are positioned beyond the laser emitter. For example, U.S. Pat. No. 8,723,121, describes an identification system and method using highly collimated source of electromagnetic radiation which emits towards a thermal imaging unit highly directional radiation and provides various examples of collimating optics intended for this purpose. Such collimation concentrates beam energy in a single direction. Such a collimated beam strategy however provides a tightly limited cone of visibility that appears to require that the beacon be aimed or mechanically scanned. The former is problematic in that the beam aiming can be challenging in a variety of situations such as combat, search and rescue, emergency rescue and other situations where the user of a beacon must be capable of doing other things while providing the beacon signal. The latter is problematic in beam scanning solutions add weight, cost and size to a beacon system while also increasing the power consumption of the system during operation.

To address these challenges, a super-pulse laser driving scheme may be used. In a super-pulse driving scheme drive circuit 106 causes high energy bursts of energy to be supplied to semiconductor laser 180 for short pulse lengths within a longer duty cycle. By operating semiconductor laser 180 in such short bursts, semiconductor laser 180 has less time to heat than semiconductor laser 180 would have in the event that it is run in a continuous mode. Further, by separating such short bursts by larger duty cycles semiconductor laser 180 is given time to cool to an extent. This reduces or eliminates the need for active cooling and the battery drain associated therewith while creating pulses of laser emission 134 that are high in intensity.

An extent of divergence of laser emission 134 from emission face 184 may be controlled as a function of the area of the emission face 184 with emission faces having larger emission areas having lower divergences than emission faces having smaller areas. Accordingly, greater divergence can be achieved through the use of smaller emission faces without the use of shaping optics.

Returning to FIG. 8, patterned emission 134 from beacon system 100 in the present system pass through a core window 172 and into distribution module 102B. In the embodiment illustrated distribution module 102B is joined to base module 102A such that a generally sealed environment is created between base module 102A, distribution module 102B, distribution module windows 140 and core window 172. This environment can contain a concentrated nitrogen atmosphere or any other gas, this environment may also comprise, substantially, a vacuum. Where gas is permitted in this area, the gas may be humidity controlled during manufacture or assembly. Alternatively, a desiccant (not shown) may be supplied inside distribution module 102B to control humidity within distribution module 102B.

In the embodiment that is illustrated distribution module windows 140 and core window 172 are not designed to have a significant impact on the divergence light passing from distribution module windows 140 into the environment outside beacon system 100. By maintaining distribution module windows 140 and core window 172 as pass-through optics (at least as to the laser beam being emitted) and controlling the shape and intensity of the laser being emitted in other ways to be describe in greater detail below, it becomes possible to provide a beacon system 100 that is rugged, light weight and efficient Specifically, it will be noted that by distribution module windows 140 are exposed to outside conditions and are subject to thermal effects—contracting in colder temperatures and expanding in hotter temperatures. While such effects can be modulated through the use of lens material that has a low coefficient of thermal expansion, doing so limits the range of materials that can be used and can impact performance, complexity laser emissions 134 to pass through less optics there is less loss of intensity of laser emissions 134.

Additionally, where distribution module windows 140 significantly impact the divergence of light passing from distribution modulation windows 140 into the environment, the relative positioning of distribution module windows 140, semiconductor laser 180 and any other components there between may become more critical. However, here too distribution module 102B would have hold distribution module windows 140 within a desirable range of distances from semiconductor laser 180 and here too distribution module 102B is exposed directly to the environment and will be subject to thermal expansion. Here too, while such effects can be modulated through building distribution module 102B using structures and materials that resist or that provide compensation for thermal expansion, doing so limits the range of materials that can be used and can impact performance, complexity or cost in ways that make the resulting product less useful to the user.

In the embodiment illustrated in FIGS. 1-8 distribution module 102B includes a reflector system 200. Reflector system 200 includes a mounting 210 that positions a reflective surface 220 to receive a substantial portion of light emitted by semiconductor laser 180.

Reflector mounting 210 is joined to distribution module 102B and may for example and without limitation be joined to any of windows 140, supports 142, or roof 146. Mounting 210 directly or indirectly supports reflective surface 220 and positions reflective surface 220 so that reflective surface 220 is positioned within laser emissions 134 and reflects laser emissions 134 so that reflected laser emissions 240 pass through windows 140 along a path and with a divergence that forms a desired pattern of intensities.

Figure 10:
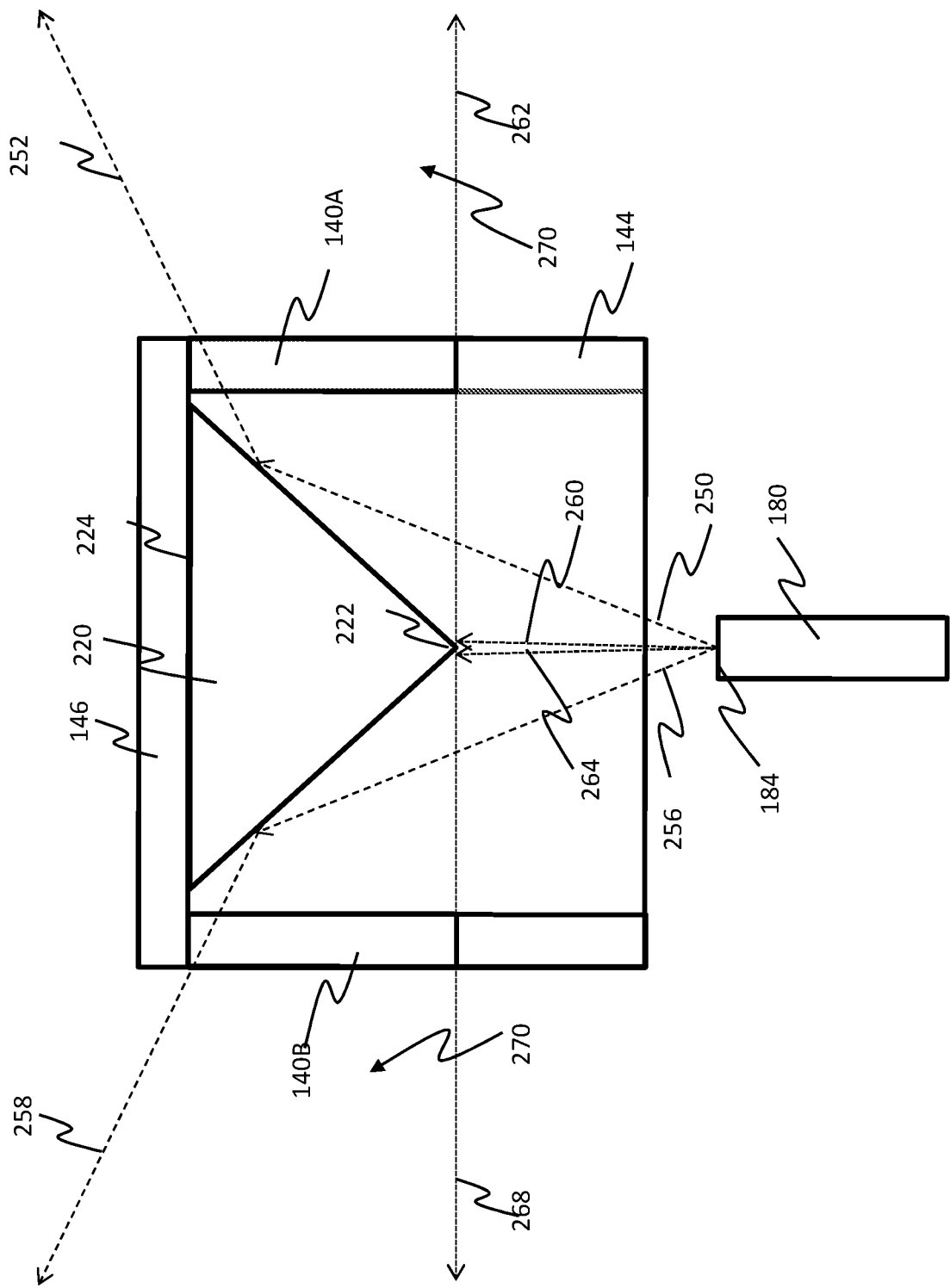
FIG. 10 schematically illustrates operation of distribution member with semiconductor laser in operation.

FIG. 10 schematically illustrates operation of distribution module 102B with semiconductor laser 180 in operation and with other components of base module 102A removed for simplicity of illustration. In this embodiment, reflective surface 220 is illustrated as a surface of a solid conical reflector such as an axicon with a reflective conical surface. As is shown in this embodiment, reflective surface 220 extends substantially from a tip 222 to an end line or end path 224 such that laser emissions 134 incident on any portion of reflective surface 220 are substantially reflected. In the embodiment illustrated reflective surface 220 is shown reflecting light in a generally specular manner. However, in embodiments reflective surface 220 may reflect light in a less than specular manner.

As is also shown in FIG. 10, in this embodiment, reflective surface 220 and semiconductor laser 180 are positioned with tip 222 substantially aligned with semiconductor laser 180 such that a pattern of light emitted by semiconductor laser 180 is generally centered upon tip 222 or otherwise positioned so that light emitted by semiconductor laser 180 strikes reflective surface 220 completely around a perimeter of reflective surface 220.

As is shown in FIG. 10, a first ray 250 travels from semiconductor laser 180 to reflective surface 220 along a first direction. When first ray 250 strikes reflective surface 220 first ray is reflected in a second direction as a reflected first ray 252. Reflected first ray 252 travels along a path that brings reflected first ray 252 through an edge portion of window 140. It will be appreciated from this that light rays incident on reflective surface 220 at points closer to roof 146 will be blocked by support 142 or roof 146. In this embodiment, such light will be unused. Accordingly, reflected first ray 252 travels along a first reflected path that in part defines an upper limit of a system emission pattern 270 from beacon system 100 through window 140A.

As is also illustrated in FIG. 10, a second ray 260 incident on a portion of reflective surface 220 that is proximate to tip 222 is reflected as a second reflected ray 262. As shown here, second reflected ray 262 travels along a second reflected direction passing through a lower portion of window 140A to, in part, define a lower limit of system emission pattern 270 from beacon system 100 in the direction of second reflected ray 262 through window 140A.

In the embodiment of FIG. 10, similar reflections generally will occur across reflective surface 220 to create a generally consistent pattern of emission from all of windows 140. For example, a third ray 256 is reflected as a reflected third ray 258 traveling along path at that will pass through an edge portion of distribution module window 140B on an opposite side of reflective surface 220 to define an upper limit of system emission pattern 270 from beacon system 100 through window 140B. Similarly, a reflected fourth ray 268 reflected by a portion of reflective surface 200 proximate to tip 222 on a side facing distribution module window 140B will travel along a path that will pass through a lower edge portion of distribution module window 140B to, in part, define a lower limit of the system emission pattern 270 from beacon system 100 through distribution module window 140B in the direction of fourth reflected ray 268.

It will be generally appreciated from this that reflective surface 220 can be used to provide a mechanism for shaping an emission pattern from semiconductor laser 180 so that this emission is directed in a predetermined system emission pattern 270 about beacon system 100 without requiring moving parts. Additionally, like can be shaped so that it is directed toward areas where the light is most likely to be detected such that the finite power and emission intensity that beacon system 100 is capable of emitting is directed in a way that is efficient and that enhances the probability of detection of beacon system 100 from a desired range of detection angles.

Reflective surface 220 may or may not have a solid core of the type illustrated in FIG. 8 and may have, for example and without limitation, a core that is hollow or that is filled with voids such as a supporting non-solid frame, a foamed or aerogel core. In embodiments, reflective surface 220 may be coated, sputtered, formed, or otherwise applied to a substrate. In embodiments, reflective surface 200 may take the form of a formed sheet or foil of material that is folded, bent, wrapped or otherwise shaped or that is shaped by an internal framework or supported by mounting 210 so as to maintain a desired shape. It will be appreciated that such embodiments may reduce the overall weight of beacon system 100 and will impact the rate at which reflective surface 220 sheds any heat. In embodiments reflector mounting 210 can take many forms including but not limited to mechanical fasteners, linkages, clips, clamping structures, welded, riveted, or adhesive linkages.

Reflective surface 220 can, in general, be any surface that is reflective in the wavelengths primarily emitted by semiconductor laser 180. In embodiments reflective surface 220 can be formed from materials such as, for example, metals such as gold and silver or other materials that are reflective such as a dielectric stack.

In embodiments, such as the one illustrated in FIGS. 1-8, reflective surface 200 may be mounted in a center portion of distribution module 102B and 102B is generally symmetrical so that any thermal responses of materials and structures forming distribution module 102B will be generally evenly applied in a plurality of offsetting ways.

Figure 11B:
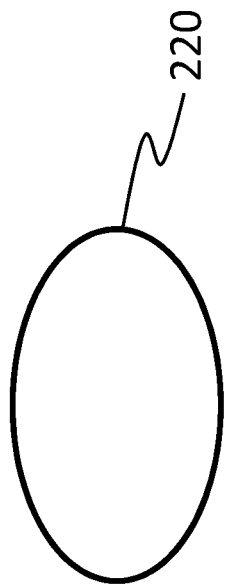
FIGS. 11A-11F illustrate reflective surfaces having a variety of shapes and configurations.
Figure 11D:
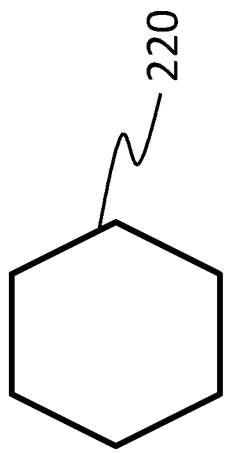
Figure 11F:
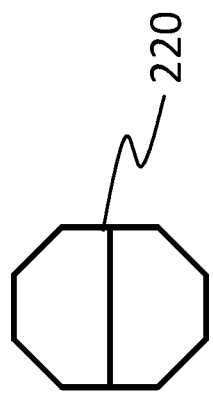
Figure 11A:
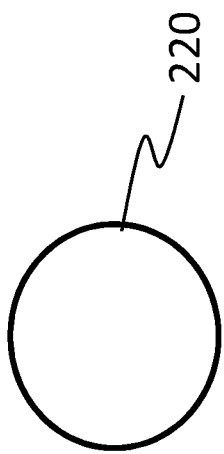
Figure 11C:
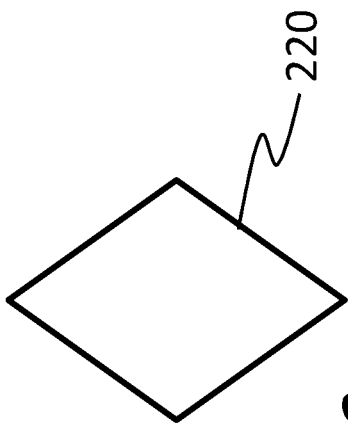
Figure 11E:
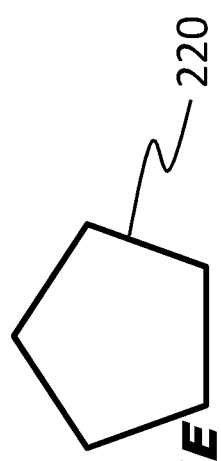
Figure 12A:
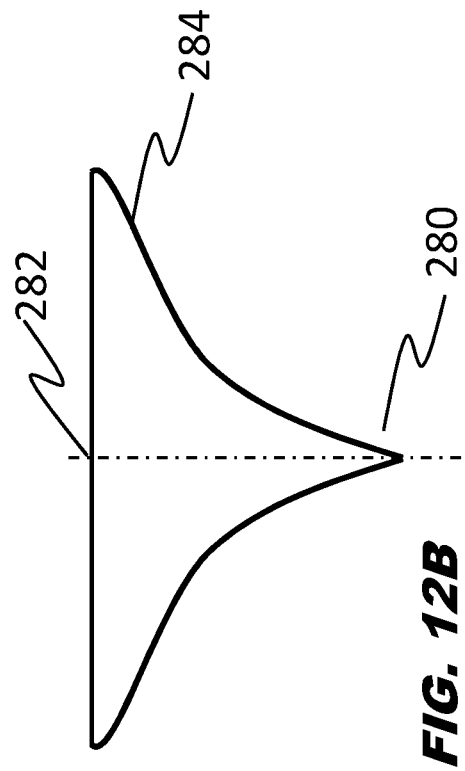
FIGS. 12A-12D illustrate side elevation views of different types of reflective surfaces.
Figure 12B:
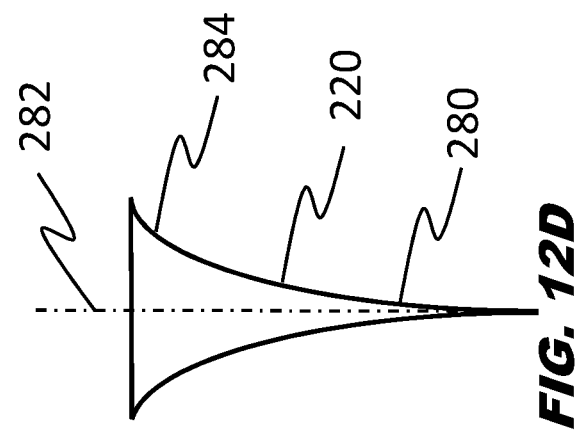
Figure 12C:
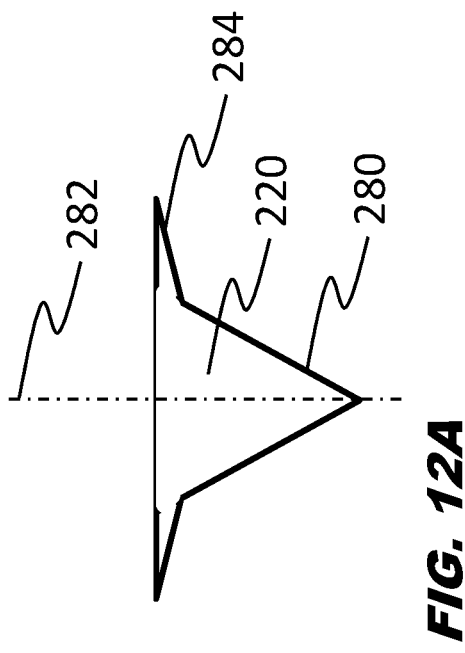
Figure 12D:
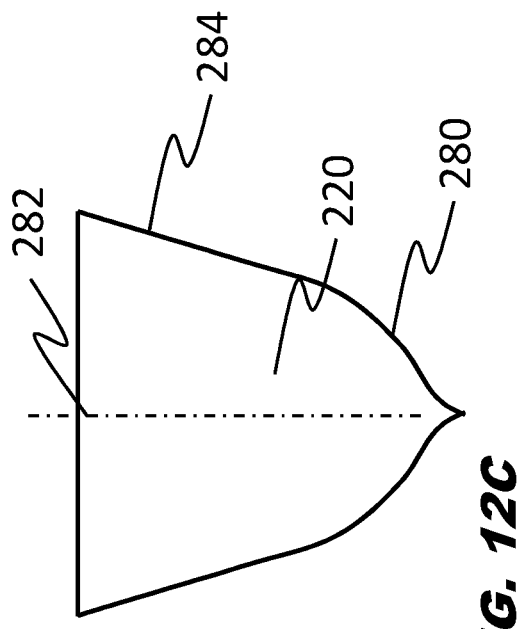

Reflective surface 220 can have a variety of shapes and configurations to shape laser emission from beacon system 100. For example, reflective surface 220 may have a cross section taken as illustrated in FIG. 10, that is circular as shown in FIG. 11A, and that may take on for example and without limitation ovular cross section shown in FIG. 11B, a four sided cross section such as diamond cross section shown in FIG. 11C, a pentagonal cross section such as is shown in FIG. 11D, a hexagonal cross section as shown in FIG. 11E, an octagonal cross section as is shown in FIG. 11F or other polygonal or other curved shapes. Additionally, there may be more one different cross-sectional shape between tip 222 and end path 224.

Additionally, in embodiments reflective surface 220 can have surfaces that have a single angle of inclination or can have multiple different angles of inclination. For example, FIGS. 12A-12D illustrates a side elevation views of different types of reflective surface 220 having a first facet or portion 280 with initial angle of inclination that is shallower relative to a center axis 282 than an angle of inclination of a second facet or portion 284 with a greater angle of inclination. Additionally reflective surface 220 can be curved or otherwise shaped so as to concentrate or distribute light emitted by semiconductor laser 180 in preferred non-uniform patterns.

Curvature or shaping of reflective surface 220 can be designed to compensate in part for asymmetries in the emission pattern of light from semiconductor laser 180. In particular it will be appreciated that such asymmetries may arise as a result of in part based upon the pattern of light emitted by semiconductor laser 180 which may not be symmetrical about a central axis of emission plane of semiconductor laser 180. For example, it will be appreciated that as an aspect ratio of certain types of semiconductor lasers 180 changes from 1:1 to greater ratios the divergence of light emitted by semiconductor laser 180 will become different along different axes thereby creating non-uniform emission intensities at different angles of view Other factors may also cause such non-uniform emission intensities. Such differences can be compensated in part by adjusting the shape of reflective surface 220 so that reflective surface 220 reflects light from more intense areas so that the intensity of light exiting from beacon system 100 will be more uniform. In more intense areas reflection with greater dispersion may be used. It will be appreciated that reflectors that are curved, faceted or otherwise shaped to concentrate light can also be used to adjust intensity patterns or distribution patterns. Additionally, it will be understood that in embodiments non-uniform distribution of light may be desirable and that reflective surface 200 may be used to create desired non-uniform patterns of light emission from beacon system 100.

Figure 13:
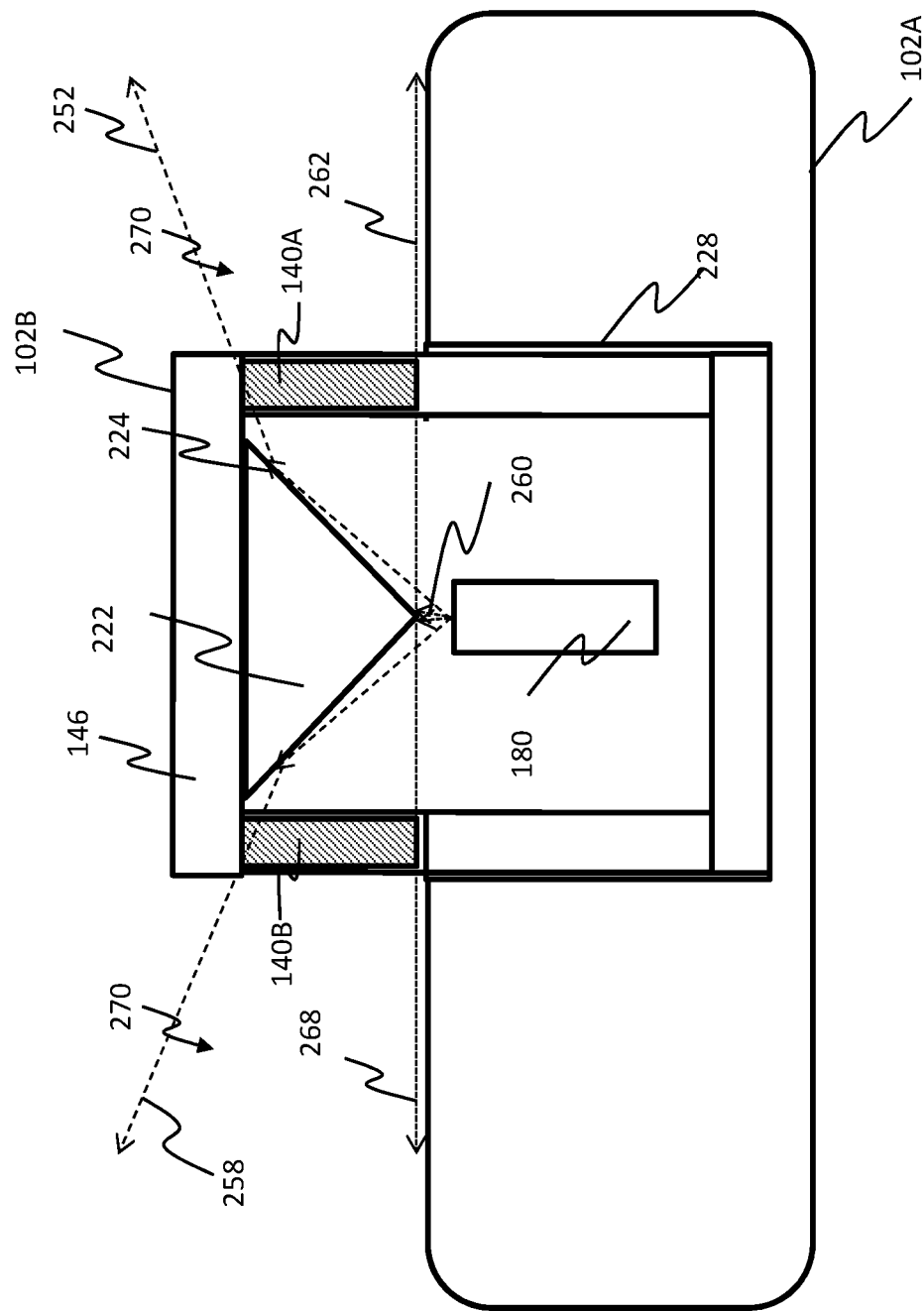
FIG. 13 illustrates another embodiment of a beacon system.

FIG. 13 illustrates another embodiment of a distribution module 102B cooperating with semiconductor laser 180. Here, a separation provided between semiconductor laser 180 and reflective surface 200 is reduced. This allows less opportunity for laser emissions 134 to diverge after leaving semiconductor laser 180 so that a reflective surface 220 that is smaller in height, diameter, cross sectional area, volume or has less surface area than a reflective surface 220 that is further separated from semiconductor laser 180 while still providing a similar output.

It will be appreciated that by reducing any height diameter, cross sectional area, volume or surface area of reflective surface 220, it becomes possible to provide a beacon system 100 with lower weight, size, cost as the size, strength and other requirements of distribution module 102B can be reduced.

Additionally, as is shown in the embodiment of FIG. 13 in embodiments, a distance between semiconductor laser 180 to reflective surface 220 can be reduced in part by enclosing both semiconductor laser 180 and reflective surface 220 in the same environment so that no barriers such as core window 172 shown in the embodiment of FIGS. 1-8 are required. Optionally, in embodiments, a modular combination of semiconductor laser 180 and distribution module 102B can be provided as a "plug in" module useful with a base module 102A having a receiving port 228 with connectors necessary to drive semiconductor laser 180 and mechanical connections to allow secure connections between "plug in" module 230. In embodiments, semiconductor laser 180 and reflective surface 220 can be provided in the form of a combined module.

Figure 14:
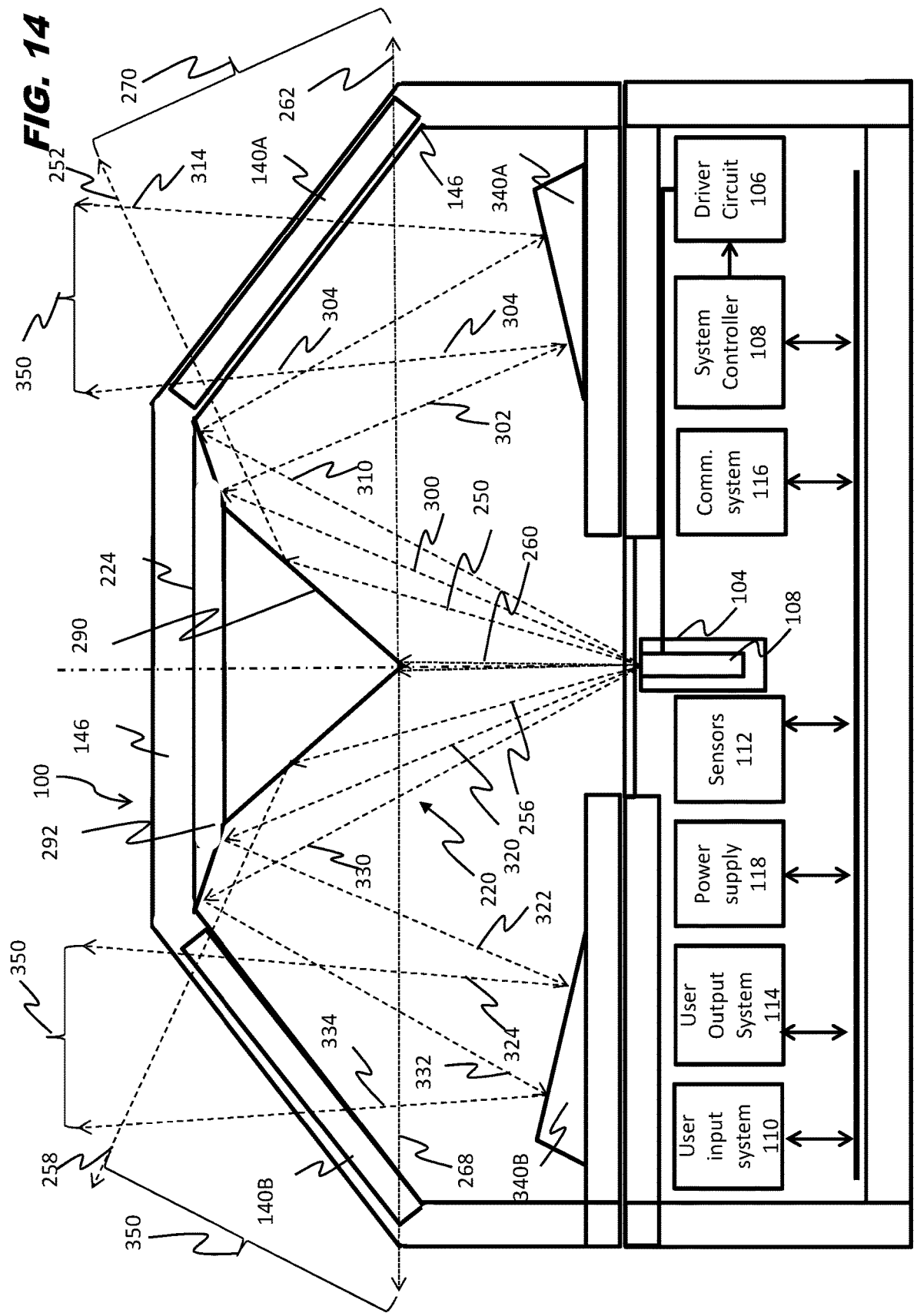
FIG. 14 illustrates still another embodiment of a beacon system.

FIG. 14 schematically illustrates operation of another embodiment of distribution module 102B with semiconductor laser 180 in operation. In this embodiment reflective surface 220 having a first reflective facet or portion 290 and a second reflective facet or portion 292.

First portion 290 is configured, to reflect as described above in this regard, reflective surface 220 extends substantially from a tip 222 to an end line or end path 224 such that laser emissions 134 incident on any portion of reflective surface 220 are substantially reflected. In the embodiment illustrated reflective surface 220 is shown reflecting light in a generally specular manner. However, in embodiments reflective surface 220 may reflect light in a less than specular manner.

As is also shown in FIG. 14, in this embodiment, reflective surface 220 and semiconductor laser 180 are positioned with tip 222 substantially aligned with semiconductor laser 180 such that a pattern of light emitted by semiconductor laser 180 is generally centered upon tip 222 or otherwise positioned so that light emitted by semiconductor laser 180 strikes reflective surface 220 completely around a perimeter of reflective surface 220.

As is shown in FIG. 14, first ray 250 travels from semiconductor laser 180 to reflective surface 220 along a first direction. When first ray 250 strikes reflective surface 220 first ray is reflected in a second direction as a reflected first ray 252. Reflected first ray 252 travels along a path that brings reflected first ray 252 through an edge portion of window 140. It will be appreciated from this that light rays incident on reflective surface 220 at points closer to roof 146 will be blocked by support 142 or roof 146. In this embodiment, such light will be unused. Accordingly, reflected first ray 252 travels along a first reflected path that in part defines an upper limit of a system emission pattern 270 from beacon system 100 through window 140A.

As is also illustrated in FIG. 14, a second ray 260 incident on a portion of reflective surface 220 that is proximate to tip 222 is reflected as a second reflected ray 262. As shown here, second reflected ray 262 travels along a second reflected direction passing through a lower portion of window 140A to, in part, define a lower limit of system emission pattern 370 from beacon system 100 in the direction of second reflected ray 262 through window 140A.

In the embodiment of FIG. 14, similar reflections generally will occur across reflective surface 220 to create a generally consistent pattern of emission from all of windows 140. For example, a third ray 256 is reflected as a reflected third ray 258 traveling along path at that will pass through an edge portion of distribution module window 140B on an opposite side of reflective surface 220 to define an upper limit of system emission pattern 270 from beacon system 100 through window 140B. Similarly, a reflected fourth ray 268 reflected by a portion of reflective surface 200 proximate to tip 222 on a side facing distribution module window 140B will travel along a path that will pass through a lower edge portion of distribution module window 140B to, in part, define a lower limit of the system emission pattern 270 from beacon system 100 through distribution module window 140B in the direction of fourth reflected ray 268.

However as is also shown in FIG. 14, in this embodiment, second facet or portion 290 is configured to reflect fifth ray 300 and sixth ray 310 to form reflected fifth ray 302 and reflected sixth ray 312 that are directed toward supplemental reflector 340A. Supplemental reflector 340A then reflects reflected fifth ray 302 and reflected sixth ray 312 as supplemental reflected rays 304 and 314 through distribution module window 140A to form a supplemental system emission pattern 350A. Similarly second facet or portion 290 is configured to reflect seventh ray 320 and sixth ray 330 to form reflected seventh ray 322 and reflected eight ray 332 that are directed toward supplemental reflector 340B. Supplemental reflector 340B then reflects reflected seventh ray 322 and reflected sixth ray 332 as supplemental reflected rays 324 and 334 through distribution module window 140B to in part, form a supplemental system emission pattern 350.

It will be appreciated that this approach provides two zones of detection that can be used to achieve greater detectability over a range of positions. Other changes are possible. In one embodiment, roof 146 and reflective surface 220 can have central portions in communication with each other through which a portion of laser emissions can pass to provide still further system emissions.

In still further embodiments, laser emissions 180 may be coupled or otherwise directed into a formed material 350 through with laser emissions 134 pass to reach a reflective surface 222 such as at a boundary between formed material 350 and a medium 352 and to reflect from reflective surface 222 to exit from windows such as windows 140A and 140B formed in material 350.

Figure 15:
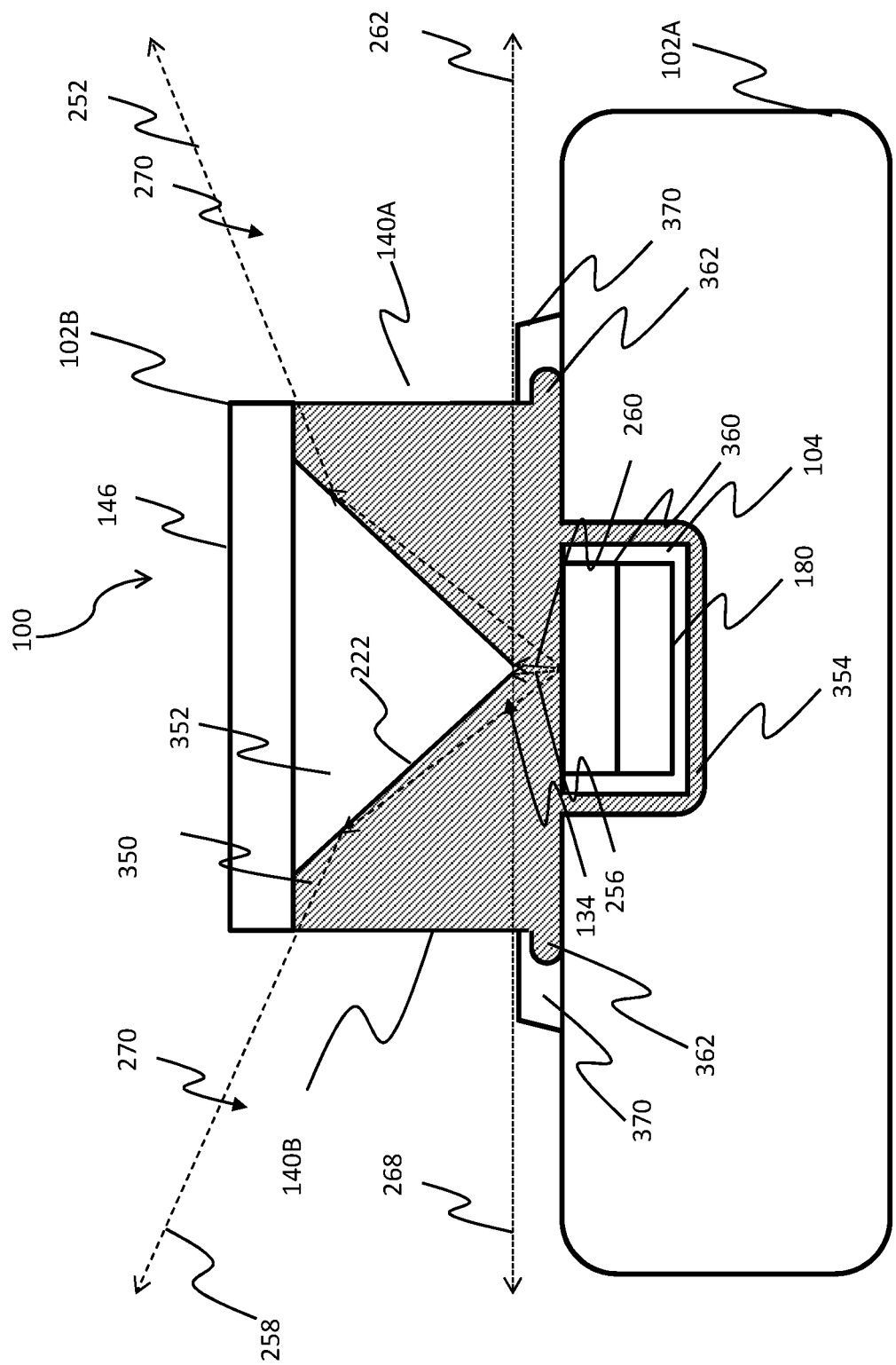
FIG. 15 illustrates additional embodiment of a reflective surface.

For example FIG. 15 shows a system illustration of yet another embodiment of a beacon system 100 having a reflection surface 200 which, in this embodiment is positioned optionally receives laser emissions 134 from a laser module 104 having a vertical surface emitting type of semiconductor laser 180 optically coupled to formed material 350 by way of an optional diffraction grating 360 or other optical coupling. Here again, first ray 150, reflected first ray 152, second ray 262, reflected second ray 262, third ray 256, reflected third ray 258, fourth ray 264 and reflected fourth ray 268 generally act as described above to create a predetermined system emission pattern 270.

In embodiments, the example of FIG. 15, a roof structure 146 may be provided as shown to protect reflective surface 220. In embodiments, medium 352 may be comprise a solid, liquid, gas or vacuum level selected to provide a predetermined combination of refractive indices required to achieve a particular reflectivity at reflective surface 220. Where a solid material is provided as medium 352, such solid material may be used to perform the functions of a roof structure 146.

As is shown in FIG. 15, formed reflector material 350 may optionally be formed with integral windows 140A and 140B, and with other features such as mounting features 362 shown here as being co-designed for mounting to clamp type mounting features 370 of base module 102A. Additionally, in embodiments formed material 350, laser module 104, including semiconductor laser 180 and any optical coupling such as diffraction grating 360, may be packaged together as a distribution module 102B having a integral laser for use and distribution in a modular fashion. In embodiments, formed reflector material 350 may be formed with features 354 to protect, house, position, locate or otherwise optically or mechanically associate laser module 104 with formed reflector material 350. It will be appreciated that, in embodiments such a formed reflector material 350 may be made to provide total internal reflection of laser emissions 134 or selected portions of laser emissions 134.

It will be appreciated that a formed reflector material 350 may be formed using molding, injection molding, casting, or other processes appropriate for materials useful with wavelengths of light to be emitted by semiconductor laser 180.

While the present invention has been particularly shown and described with references to preferred embodiments thereof, it will be understood by those skilled in the art that various changes in form and details may be made therein without departing from the spirit and scope of the invention as defined by the appended claims.

What is claimed is:
1. A system, comprising:
a housing;
a light source disposed within a portion of the housing and configured to emit divergent radiation; and
a reflector disposed optically downstream of the light source, the reflector comprising a single piece of formed material optically coupled to the light source and configured to internally reflect at least a portion of the divergent radiation, the piece of material comprising a solid reverse axicon, the reflector including:
a first surface comprising an external surface of the piece of material, the light source being positioned such that the divergent radiation emitted by the light source passes through a medium from the light source to first surface, and
a substantially conical reflective surface comprising an internal surface of the piece of material, the reflective surface being configured to:
receive the divergent radiation emitted by the light source and passing into the piece of material via the first surface, and
direct the divergent radiation to pass through the piece of material and exit the reflector via a second surface of the piece of material, the second surface comprising an external surface of the piece of material extending substantially perpendicular to the first surface, the divergent radiation exiting the reflector within a predetermined emission pattern, the emission pattern having:
a lower limit extending substantially parallel to an emission face of the light source, and
an upper limit extending at an included angle of less than approximately 60 degrees relative to the lower limit.

2. The system of claim 1, wherein:
the light source comprises one of a diode laser, a quantum cascade laser, or an inter-band laser; and
the divergent radiation has a wavelength between 2 μm and 30 μm.

3. The system of claim 1, wherein the reflective surface comprises:
a tip disposed opposite and facing the light source, and
a cross-sectional shape comprising one of a polygon, a circle, or an oval.

4. The system of claim 3, wherein the tip is substantially centrally aligned with the light source such that the divergent radiation emitted by the light source impinges upon the reflective surface substantially completely around a perimeter of the reflective surface.

5. The system of claim 1, wherein the housing forms a generally sealed environment, and the reflector is disposed within the generally sealed environment.

6. The system of claim 2, wherein:
the housing comprises a base module, a distribution module joined to the base module, and a distribution window disposed optically downstream of the reflective surface; and the generally sealed environment is formed, at least in part, by the distribution module and the distribution window.

7. The system of claim 2, wherein the generally sealed environment comprises a humidity-controlled environment containing concentrated nitrogen.

8. The system of claim 1, further comprising a controller operably connected to the light source, the controller being configured to:
cause the light source to operate in at least one of a first duty cycle, or a second duty cycle different from the first duty cycle; and
cause the light source to emit the radiation with a desired frequency signature.

9. The system of claim 8, further comprising at least one of:
an input sensor configured to detect a user input action and provide a signal to the controller indicative of the user input action, or
a video display operably connected to the controller and configured to generate a human perceptible signal.

10. The system of claim 1, wherein:
the reflective surface is disposed at a first acute included angle relative to the first surface, and at a second acute included angle relative to the second surface,
the divergent radiation emitted by the light source diverges as it passes through the medium from the light source to the first surface, and
the piece of material provides total internal reflection of the divergent radiation.

11. A system, comprising:
a housing including a base module, and a distribution module joined to the base module, the distribution module having a window;
a semiconductor laser disposed within the base module and configured to emit divergent radiation; and
a reflector disposed within the distribution module and optically downstream of the semiconductor laser, the reflector comprising a single piece of formed material optically coupled to the semiconductor laser and configured to internally reflect at least a portion of the divergent radiation, the piece of material comprising a solid reverse axicon, the reflector including:
a first surface comprising an external surface of the piece of material, the semiconductor laser being positioned such that the divergent radiation passes through a medium from the semiconductor laser to first surface, and
a reflective surface comprising an internal surface of the piece of material, the reflective surface being configured to:
receive the divergent radiation emitted by the semiconductor laser and passing into the piece of material via the first surface, the divergent radiation diverging as it passes from the first surface to the reflective surface, and
direct the divergent radiation to pass through the piece of material and exit the reflector via a second surface of the piece of material, the second surface comprising an external surface of the piece of material extending substantially perpendicular to the first surface, the divergent radiation exiting the reflector within a substantially conical emission pattern extending about the housing, the emission pattern having:
a lower limit extending substantially parallel to an emission face of the semiconductor laser, and
an upper limit extending at an included angle of less than approximately 60 degrees relative to the lower limit.

12. The system of claim 11, wherein the reflective surface comprises a tip substantially centrally aligned with the semiconductor laser such that the divergent radiation emitted by the semiconductor laser impinges upon the reflective surface substantially completely around a perimeter of the reflective surface.

13. The system of claim 12, wherein the distribution module and the window form a generally sealed environment of the housing, the reflector is disposed within the generally sealed environment, and the divergent radiation exiting the reflector exits the housing via the window.

14. The system of claim 12, further comprising a driver operably connected to the semiconductor laser, the driver being configured to modulate a pulse pattern of the divergent radiation emitted by the semiconductor laser, over time, at a frequency between 2 Hz and 10 Hz.

15. The system of claim 11, wherein reflective surface comprises:
a first portion having a first angle of inclination relative to a central longitudinal axis of the reflector; and
a second portion having a second angle of inclination relative to the central longitudinal axis different from the first angle of inclination.

16. The system of claim 11, wherein the reflective surface is curved so as to distribute the divergent radiation in a non-uniform pattern.

17. A system, comprising:
a housing;
a semiconductor laser disposed within the housing and configured to emit divergent radiation; and
a reflector disposed optically downstream of the semiconductor laser, the reflector comprising a single piece of formed material configured to internally reflect at least a portion of the divergent radiation, the piece of material comprising a solid reverse axicon, the reflector being optically coupled to the semiconductor laser by way of an optical coupling, the reflector including:
a first surface comprising an external surface of the piece of material, the semiconductor laser being positioned such that radiation emitted by the semiconductor laser passes through a medium from the light source to first surface, and
a reflective surface comprising an internal surface of the piece of material, the reflective surface being configured to:
receive divergent radiation emitted by the semiconductor laser and passing into the piece of material via the first surface, the divergent radiation diverging as is passes from the first surface to the reflective surface, and
direct the divergent radiation to pass through the piece of material and exit the reflector via a second surface of the piece of material, the second surface comprising an external surface of the piece of material extending substantially perpendicular to the first surface, the divergent radiation exiting the reflector within a substantially conical emission pattern extending about the housing, the emission pattern having:
a lower limit extending substantially parallel to an emission face of the semiconductor laser, and
an upper limit extending at an included angle of less than approximately 60 degrees relative to the lower limit.

18. The system of claim 17, wherein at least the semiconductor laser and the formed material comprise a modular distribution module of the system,
the modular distribution module being coupled to the housing via a mounting feature formed by the formed material.

\* \* \* \* \*